United States Patent
Youn et al.

(10) Patent No.: US 10,680,040 B2
(45) Date of Patent: Jun. 9, 2020

(54) ELECTROLUMINESCENT DISPLAY DEVICE

(71) Applicant: LG Display Co., Ltd., Seoul (KR)

(72) Inventors: JunHo Youn, Paju-si (KR); Heumeil Baek, Paju-si (KR); YunJoo Cho, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/234,261

(22) Filed: Dec. 27, 2018

(65) Prior Publication Data
US 2019/0198580 A1 Jun. 27, 2019

(30) Foreign Application Priority Data

Dec. 27, 2017 (KR) .......................... 10-2017-0180714

(51) Int. Cl.
*H01L 27/32* (2006.01)
*H01L 51/50* (2006.01)
*H01L 51/52* (2006.01)
*H01L 51/00* (2006.01)
*H01L 51/56* (2006.01)

(52) U.S. Cl.
CPC ........ *H01L 27/3216* (2013.01); *H01L 27/326* (2013.01); *H01L 27/3223* (2013.01); *H01L 27/3246* (2013.01); *H01L 51/5012* (2013.01); *H01L 51/5209* (2013.01); *H01L 51/5225* (2013.01); *H01L 51/0005* (2013.01); *H01L 51/56* (2013.01)

(58) Field of Classification Search
CPC .......................... H01L 27/3216; H01L 51/5225
See application file for complete search history.

(56) References Cited

U.S. PATENT DOCUMENTS

| | | |
|---|---|---|
| 2010/0188246 A1 | 7/2010 | Getrost et al. |
| 2013/0038203 A1* | 2/2013 | Kim .................... H01L 51/5215 313/504 |
| 2015/0029208 A1 | 1/2015 | Kim |
| 2015/0048380 A1 | 2/2015 | Koike et al. |
| 2015/0155516 A1* | 6/2015 | Yamashita .......... H01L 51/5056 257/40 |
| 2016/0155983 A1* | 6/2016 | Lee ..................... H01L 51/5209 257/40 |

FOREIGN PATENT DOCUMENTS

| | | |
|---|---|---|
| EP | 2942822 A1 | 11/2015 |
| KR | 10-2015-0012542 A | 2/2015 |
| TW | 200911021 A | 3/2009 |

* cited by examiner

*Primary Examiner* — Farun Lu
(74) *Attorney, Agent, or Firm* — Birch, Stewart, Kolasch & Birch, LLP

(57) ABSTRACT

An electroluminescent display device includes a first electrode provided on a substrate, a bank disposed on the first electrode and defining a plurality of emission areas above the first electrode, an emission layer provided in the plurality of emission areas and configured to emit light wherein the emission layer in each of the plurality of emission areas has a curved top surface, and a second electrode provided on the bank and the emission layer, wherein among the plurality of emission areas, each of a first emission area and a second emission area is provided with a rounded corner, and wherein a first radius curvature (R1) in the rounded corner of the first emission area is different from a second radius curvature (R2) in the corner of the second emission area.

10 Claims, 9 Drawing Sheets

ELECTROLUMINESCENT DISPLAY DEVICE

CROSS-REFERENCE TO RELATED APPLICATIONS

This application claims the priority benefit of the Korean Patent Application No. 10-2017-0180714 filed on Dec. 27, 2017 in the Republic of Korea, which is hereby incorporated by reference as if fully set forth herein.

BACKGROUND

Technical Field

The present disclosure relates to an electroluminescent display device, and more particularly, to an electroluminescent display device having an emission layer manufactured by a solution process.

Description of the Related Art

An electroluminescent display device is provided in such way that an emission layer is formed between two electrodes. Accordingly, as the emission layer emits light by an electric field between the two electrodes, an image is displayed on the electroluminescent display device.

The emission layer can be formed of an organic material which emits light when exciton is produced by a bond of electron and hole, and the exciton falls to a ground state from an excited state. Otherwise the emission layer can be formed of an inorganic material such as quantum dot.

Hereinafter, a related art electroluminescent display device will be described with reference to FIGS. 1A and 1B.

FIG. 1A is a cross sectional view illustrating a related art electroluminescent display device. FIG. 1B is a plane view illustrating the related art electroluminescent display device of FIG. 1B.

As shown in FIG. 1A, the related art electroluminescent display device can include a substrate 10, a circuit device layer 20, a first electrode 30, a bank 40, and an emission layer 50.

The circuit device layer 20 is formed on the first substrate 10. Herein, various signal lines, a thin film transistor, and a capacitor are formed in the circuit device layer 20.

The first electrode 30 is formed on the circuit device layer 20. The first electrode 30 is patterned by each pixel, wherein the first electrode 30 functions as an anode of the electroluminescent display device.

The bank 40 is formed in a matrix configuration, to thereby define a plurality of emission areas E.

The emission layer 50 can include red (R), green (G), and blue (B) emission layers respectively formed in the plurality of emission areas E defined by the bank 40.

As shown in FIG. 1B, the bank 40 is formed in the matrix configuration so as to define the plurality of emission areas E on the substrate 10, and the emission layer 50 including the red (R), green (G), and blue (B) emission layers is formed in the plurality of emission areas E.

Each of the plurality of emission areas E is formed in a quadrangle structure on the plane, and the emission layer 50 is formed in the emission area E of the quadrangle structure by a solution process using an inkjet apparatus.

However, in case of the related art, if the emission layer 50 is formed in the emission area E of the quadrangle structure by the solution process, there is a possibility that the emission layer 50 does not spread to a corner portion 'A' of the emission area E.

In this case, a light emission may not be uniform between the corner portion 'A' of the emission area E and a central portion 'B' of the emission area E, which deteriorates a picture quality of the electroluminescent display device.

BRIEF SUMMARY

The present disclosure has been made to address the above problems and limitations associated with the related art, and it is an object of the present disclosure to provide an electroluminescent display device capable of realizing a uniform light emission in all areas including a corner portion and a central portion of each individual emission area.

In accordance with an aspect of the present disclosure, the above and other objects can be accomplished by the provision of an electroluminescent display device including a first electrode provided on a substrate, a bank disposed on the first electrode and defining a plurality of emission areas above the first electrode, an emission layer provided in the plurality of emission areas and configured to emit light wherein the emission layer in each of the plurality of emission areas has a curved top surface, and a second electrode provided on the bank and the emission layer, wherein among the plurality of emission areas, each of a first emission area and a second emission area is provided with a rounded corner, and wherein a first radius curvature (R1) in the rounded corner of the first emission area is different from a second radius curvature (R2) in the corner of the second emission area.

In accordance with another aspect of the present disclosure, there is provided an electroluminescent display device comprising a first electrode provided on a substrate; a bank disposed on the first electrode and defining first, second and third emission areas above the first electrode; a first emission layer in the first emission area and configured to emit light; a second emission layer in the second emission area and configured to emit light; and a third emission layer in the third emission area and configured to emit light, wherein each of the first, second and third emission layers has a curved top surface, wherein each of the first emission area, the second emission area, and the third emission area is formed in a polygonal structure with a rounded corner, and wherein a third radius curvature (R3) in the rounded corner of the third emission area is larger than a first radius curvature (R1) in the rounded corner of the first emission area and a second radius curvature (R2) in the rounded corner of the second emission area.

In accordance with a further aspect of the present disclosure, there is provided an electroluminescent display device comprising a substrate including an active area and a dummy area provided in a periphery of the active area, wherein an image is displayed in the active area, but is not displayed in the dummy area; and a bank configured to define a plurality of emission areas in the active area of the substrate, and define a plurality of dummy emission areas in the dummy area of the substrate, wherein the plurality of emission areas include a first emission area provided with a rounded corner, and a second emission area provided with a rounded corner, wherein an area of the second emission area is larger than an area of the first emission area, and wherein a second radius curvature (R2) in the rounded corner of the second emission area is larger than a first radius curvature (R1) in the rounded corner of the first emission area.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1A:
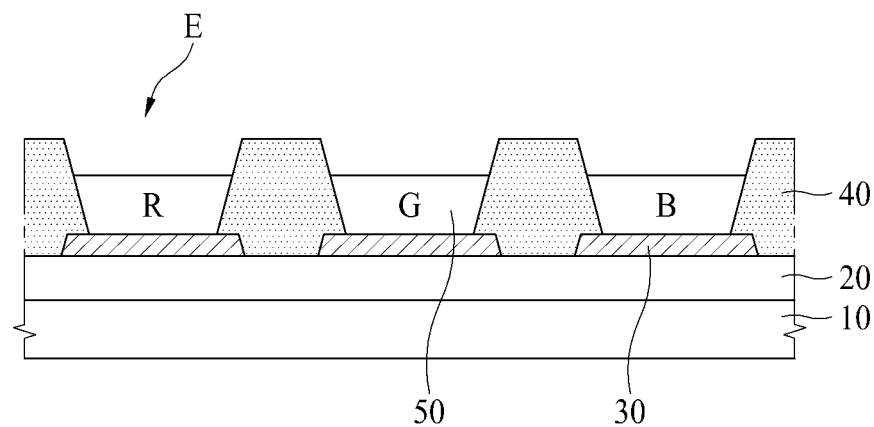
FIG. 1A is a cross sectional view illustrating a related art electroluminescent display device.
Figure 1B:
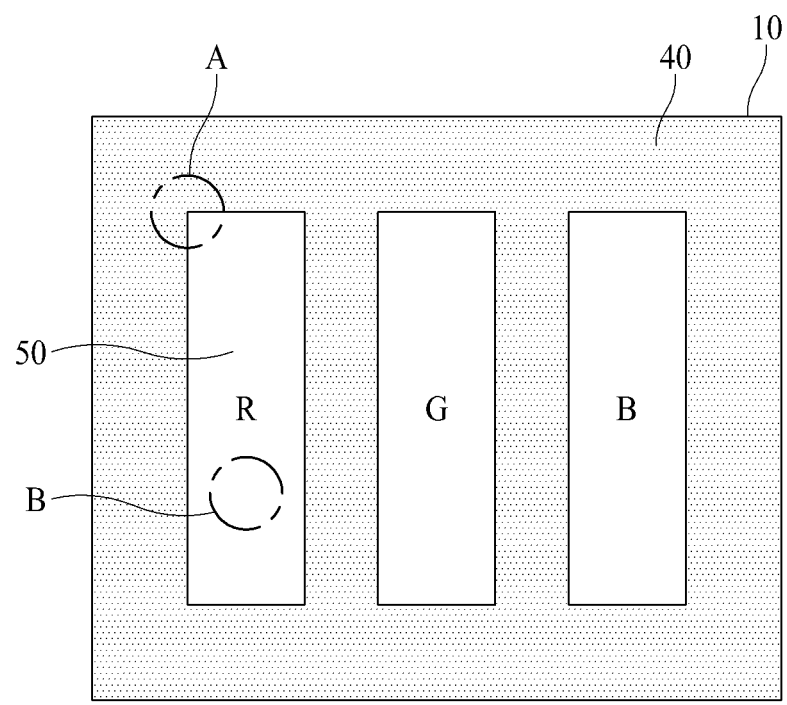
FIG. 1B is a plane view illustrating the related art electroluminescent display device of FIG. 1A.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part can also be present unless "only" is used. The terms in a singular form can include plural forms unless noted to the contrary.

In construing an element, the element is construed as including an error region although there is no explicit description thereof.

In describing a positional relationship, for example, when the positional order is described as "on," "above," "below," and "next," the case of no contact therebetween can be included, unless "just" or "direct" is used. If it is mentioned that a first element is positioned "on" a second element, it does not mean that the first element is essentially positioned above the second element in the figure. The upper part and the lower part of an object concerned can be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous can be included, unless "just" or "direct" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and can be meant as directions having wider directivities within the range within which the components of the present disclosure can operate functionally.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, an electroluminescent display device according to the embodiments of the present disclosure will be described in detail with reference to the accompanying drawings. All components of the electroluminescent display devices according to all embodiments of the present disclosure are operatively coupled and configured.

Figure 2:
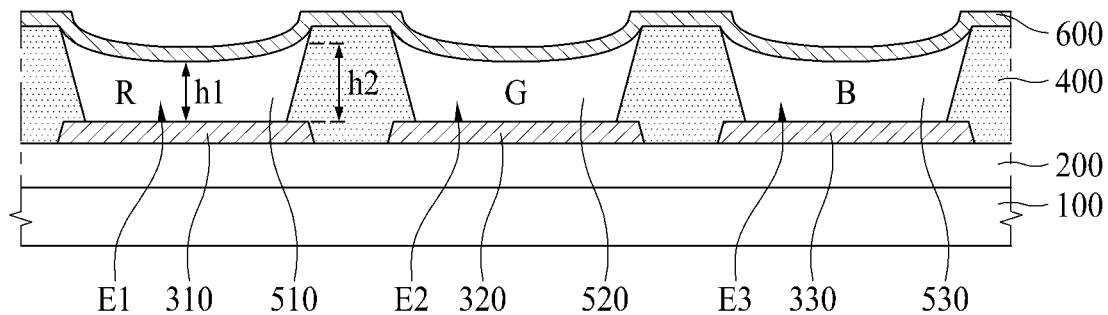
FIG. 2 is a cross sectional view illustrating an electroluminescent display device according to one embodiment of the present disclosure.

FIG. 2 is a cross sectional view illustrating an electroluminescent display device according to one embodiment of the present disclosure.

As shown in FIG. 2 the electroluminescent display device according to one embodiment of the present disclosure can include a substrate 100, a circuit device layer 200, a first electrode 310, 320 and 330, a bank 400, an emission layer 510, 520 and 530, and a second electrode 600.

The substrate 100 can be formed of a glass or plastic material, but is not limited to this material and other variations are possible. The substrate 100 can be formed of a transparent material or opaque material.

When the electroluminescent display device according to one embodiment of the present disclosure is formed in a top emission type where the emitted light advances toward an upper side, the substrate 100 can be formed of the opaque material as well as the transparent material. Meanwhile, when the electroluminescent display device according to one embodiment of the present disclosure is a bottom emission type where the light emitted from the emission layer 500 advances toward a lower side, the first substrate 100 can be formed of only the transparent material.

The circuit device layer 200 is formed on the substrate 100. As part of the circuit device layer 200, a circuit device including various signal lines, a thin film transistor and a capacitor is provided for each of a plurality of pixels. The signal lines can include a gate line, a data line, a power line, and a reference line, and the thin film transistor can include a switching thin film transistor, a driving thin film transistor, and a sensing thin film transistor. Other variations are possible.

As the switching thin film transistor is switched in accordance with a gate signal supplied to the gate line, a data voltage provided from the data line is supplied to the driving thin film transistor by the use of the switching thin film transistor.

As the driving thin film transistor is switched in accordance with the data voltage supplied from the switching thin film transistor, a data current is generated by the electric power supplied from the power line, and the generated data current is supplied to the first electrode 310, 320 and 330.

The sensing thin film transistor is provided to sense a threshold voltage deviation of the driving thin film transistor, which may cause a deterioration of picture quality. The sensing thin film transistor supplies a current of the driving thin film transistor to the reference line in response to a sensing control signal supplied from the gate line or an additional sensing line.

The capacitor maintains the data voltage supplied to the driving thin film transistor for one frame period. The capacitor is connected with each of the gate and source terminals of the driving thin film transistor.

The first electrode 310, 320 and 330 is formed on the circuit device layer 200. The first electrode 310, 320 and 330 is patterned by each pixel, and the first electrode 310, 320 and 330 functions as an anode of the electroluminescent display device. The first electrode 310, 320 or 330 can be connected with the corresponding driving thin film transistor included in the circuit device layer 200.

If the electroluminescent display device according to one embodiment of the present disclosure is applied to a top emission type, the first electrodes 310, 320 and 330 can include a reflective material for upwardly reflecting the light emitted from the emission layers 510, 502 and 530, respectively. In this case, the first electrodes 310, 320 and 330 can be formed in a stacked structure including the reflective material and transparent conductive material. On the other hand, if the electroluminescent display device according to one embodiment of the present disclosure is formed in a bottom emission type, the first electrodes 310, 320 and 330 can be formed of the transparent conductive material.

The bank 400 is formed in a matrix configuration on the boundary line between the adjacent pixels, to thereby define emission areas E1, E2 and E3 in the plurality of pixels. That is, an opening portion in which the bank 400 is not formed becomes the emission areas E1, E2 and E3.

The bank 400 is configured to cover ends of the first electrodes 310, 320 and 330, and is formed on the circuit device layer 200. Thus, the plurality of first electrodes 310, 320 and 330 patterned for the plurality of pixels can be insulated from each other by the bank 400. In this case, exposed portions of the first electrodes 310, 320 and 330, which are exposed without being covered by the bank 400, correspond to the emission areas E1, E2 and E3, respectively.

The bank 400 can be formed of an organic insulating material having a hydrophilic property. In this case, the emission layers 510, 520 and 530 smoothly spread to a lateral surface of the bank 400 so that the emission layers 510, 520 and 530 are uniformly formed in each of the emission areas E1, E2 and E3, respectively.

Meanwhile, if the entire area of the bank 400 were to have the hydrophilic property, the emission layers 510, 520 and 530 formed in any one of the emission areas E1, E2 and E3 can overflow into the neighboring emission area E1, E2 or E3 over an upper surface of the bank 400, whereby the emission layers 510, 520 and 530 formed in any one of the emission areas E1, E2 and E3 can be mixed together with the emission layers 510, 520 and 530 formed in the neighboring emission areas E1, E2 and E3, which may not be desirable. Thus, according to the present disclosure, the upper surface of the bank 400 is formed to have a hydrophobic property so as to prevent such mixture of the neighboring emission layers 510, 520 and 530. To accomplish this, the bank 400 can be formed by coating a mixture solution of an organic insulating material having the hydrophilic property and a hydrophobic material such as fluorine, and patterning the coated mixture solution by using a photolithography process. By the light irradiated in the photolithography process, the hydrophobic material such as fluorine can move to an upper portion of the bank 400, whereby the upper portion of the bank 400 can then effectively have the hydrophobic property, while the remaining portions of the bank 400 can have the hydrophilic property. This prevents the mixing issue discussed above. In this case, the upper surface of the bank 400 has the hydrophobic property so that it is possible to decrease the spread of the neighboring emission layers 510, 520 and 530 into the upper surface of the bank 400 to some degrees, thereby preventing or minimizing a problem related with a possible mixture of the neighboring emission layers 510, 520 and 530.

Referring back to FIG. 2, the emission layers 510, 520 and 530 are formed on the first electrodes 310, 320 and 330, respectively. In detail, the emission layers 510, 520 and 530 are formed in the emission areas E1, E2 and E3, respectively, defined by the bank 400.

The emission layers 510, 520 and 530 can include the first emission layer 510 provided in the first emission area E1 of a first pixel, the second emission layer 520 provided in the second emission area E2 of a second pixel, and the third emission layer 530 provided in the third emission area E3 of a third pixel among the plurality of pixels. In an example, the first emission layer 510 is formed of a red (R) emission layer, the second emission layer 520 is formed of a green (G) emission layer, and the third emission layer 530 is formed of a blue (B) emission layer. That is, the respective emission layers 510, 520 and 530 can be formed of the emission layers for emitting the different-colored lights in the different pixels.

The emission layers 510, 520 and 530 are patterned in the emission areas E1, E2 and E3 by an inkjet process without a mask. In this case, a height (h1) of an upper surface of the emission layers 510, 520 and 530 in the center portion of the emission areas E1, E2 and E3 after a drying process of the solution for forming the emission layers 510, 520 and 530, is lower than a height (h2) of an upper surface of the emission layers 510, 520 and 530 in the side portion of the emission areas E1, E2 and E3, and more particularly, in the circumference portion of the emission areas E1, E2 and E3 being in contact with the bank 400. For example, as shown in FIG. 2, as the height of each of the emission layers 510, 520 and 530 is gradually lowered from the side portion of the corresponding emission area E1, E2 or E3 being in contact with the bank 400 to the center portion of the corresponding emission area E1, E2 or E3, it is possible to realize a gradually-lowered profile shape. Accordingly, a portion (e.g., top portion) of the second electrode 600 formed on the emission layers 510, 520 and 530 can have a profile corresponding to the profile of the emission layers 510, 520 and 530.

The emission layers 510, 520 and 530 can include at least one organic layer among a hole injecting layer (HIL), a hole transporting layer (HTL), an emitting material layer (EML), and an electron transporting layer (ETL).

The second electrode 600 is formed on the emission layers 510, 520 and 530. The second electrode 600 can function as a cathode of the electroluminescent display device. Accordingly as the second electrode 600 is formed on the bank 400 as well as the emission layers 510, 520 and 530, the second electrode 600 is formed in the plurality of pixels, and also formed in the boundary line between each of the plurality of pixels. Thus, the second electrode 600 can function as a common electrode for applying a common voltage to the plurality of pixels.

If the electroluminescent display device according to one embodiment of the present disclosure is formed in a top emission type, the second electrode 600 can be formed of a transparent conductive material for upwardly radiating the light emitted from the emission layers 510, 520 and 530, or can be formed to have a thin thickness so as to improve transmittance. On the other hand, if the electroluminescent display device according to one embodiment of the present disclosure is formed in a bottom emission type, the second electrode 600 can include a reflective material for downwardly reflecting the light emitted from the emission layers 510, 520 and 530.

Further, an encapsulation layer can be additionally provided on the second electrode 600. The encapsulation layer prevents the external moisture and oxygen from being permeated into the emission layers 510, 520 and 530. The encapsulation layer can be formed of an inorganic insulating material, or can be formed in a deposition structure obtained by alternately depositing an inorganic insulating material and an organic insulating material, but not limited to these structures. Obviously, the electroluminescent display device according to the embodiments of the present disclosure can include other layers and structures.

Figure 3:
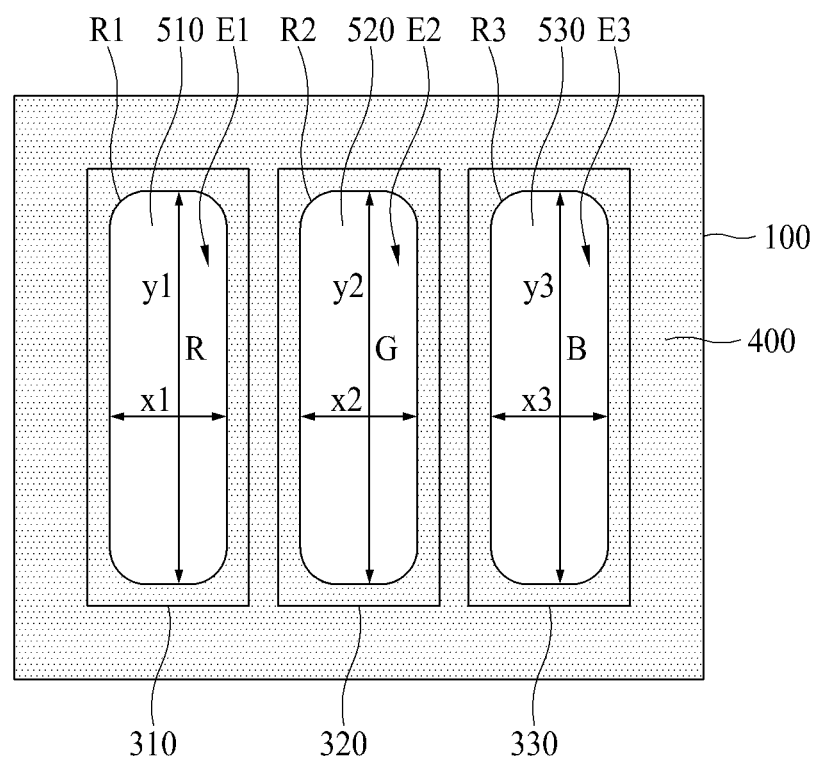
FIG. 3 is a plane view illustrating an electroluminescent display device according to one embodiment of the present disclosure.

FIG. 3 is a plane view illustrating an electroluminescent display device according to one embodiment of the present disclosure.

As shown in FIG. 3, a bank 400 is formed in a matrix configuration so as to define a first emission area E1, a second emission area E2, and a third emission area E3 on a substrate 100. A first emission layer 510 for emitting red (R) light is formed in the first emission area E1, a second emission layer 520 for emitting green (G) light is formed in the second emission area E2, and a third emission layer 530 for emitting blue (B) light is formed in the third emission area E3. The electroluminescent display device of FIG. 3 and any other subsequent figures (FIGS. 4-13) includes other known components such as a second electrode (e.g., 600 or the like in FIG. 2), a circuit device layer (e.g., 200 or the like in FIG. 2), etc.

The first emission area E1, the second emission area E2, and the third emission area E3 are arranged in a horizontal direction. Each of the first emission area E1, the second emission area E2, and the third emission area E3 is formed in a quadrangle structure, and more particularly, a rectangular structure where each corner of the rectangular structure is not angular, but is rounded. That is, any one corner of the first emission area E1 is formed in a rounded structure with a first radius curvature R1, any one corner of the second emission area E2 is formed in a rounded structure with a second radius curvature R2, and any one corner of the third emission area E3 is formed in a rounded structure with a third radius curvature R3. In this case, the other three corners of the first emission area E1 can be formed in the rounded structure with the first radius curvature R1, the other three corners of the second emission area E2 can be formed in the rounded structure with the second radius curvature R2, and the other three corners of the third emission area E3 can be formed in the rounded structure with the third radius curvature R3.

The emission layers 510, 520 and 530 are filled in the emission area E1, E2 and E3, respectively, whereby a plane structure of the emission layers 510, 520 and 530 can be formed in a structure corresponding to a plane structure of the emission areas E1, E2 and E3. Thus, each of the first emission layer 510, the second emission layer 520, and the third emission layer 530 is formed in a rectangular structure on the plane, wherein each (or at least one) corner of the rectangular structure is not angled, but is rounded.

According to one embodiment of the present disclosure, the corner(s) of the emission areas E1, E2 and E3 are formed in the rounded shape. Thus, when the emission layers 510, 520 and 530 are formed by a solution process, the emission layers 510, 520 and 530 smoothly spread to the corner(s) of the emission areas E1, E2 and E3 so that it is possible to realize a uniform light emission in each corner portion of the emission areas E1, E2 and E3 and a central portion of the emission areas E1, E2 and E3.

In the drawings, the emission areas E1, E2 and E3 are formed in the rectangular structure with the rounded corners on the plane, but are not limited to this structure. The emission areas E1, E2 and E3 can be formed in various polygonal structures with rounded corners.

According to one embodiment of the present disclosure, a short-axis width x1 of the first emission area E1, a short-axis width x2 of the second emission area E2, and a short-axis width x3 of the third emission area E3 are identical to one another. Also, a long-axis width y1 of the first emission area E1, a long-axis width y2 of the second emission area E2, and a long-axis width y3 of the third emission area E3 are identical to one another. In this present disclosure, the short-axis widths x1, x2 and x3 and the long-axis widths y1, y2 and y3 of the emission areas E1, E2 and E3 indicate the widths of the area except the rounded corner, which indicate the widths in the center axes of the emission areas E1, E2 and E3.

In this example, the first emission area E1, the second emission area E2, and the third emission area E3 are formed to have the same structure. In this case, spreading of the emission layers 510, 520 and 530 is identical in each of the emission areas E1, E2 and E3, whereby the first radius curvature R1 of at least one corner of the first emission area E1, the second radius curvature R2 of at least one corner of the second emission area E2, and the third radius curvature R3 of at least one corner of the third emission area E3 can be identically set.

Especially, if the long-axis width y1 of the first emission area E1, the long-axis width y2 of the second emission area E2, and the long-axis width y3 of the third emission area E3 are identical to one another, a value for the individual radius curvatures R1, R2 and R3 can be set based on the short-axis widths x1, x2 and x3 of each of the emission areas E1, E2 and E3, respectively. In detail, the value of the individual radius curvatures R1, R2 and R3 can be set within a range of:

$$[0.25*(x1,x2, \text{ or } x3)] \sim [0.5*(x1,x2, \text{ or } x3)].$$

That is, the value of the first radius curvature R1 is set within a range of (0.25*x1)~(0.5*x1), the value of the second radius curvature R2 is set within a range of (0.25*x2)~(0.5*x2), and the value of the third radius curvature R3 is set within a range of (0.25*x3)~(0.5*x3). In the present application, the asterisk symbol (*) is used to indicate a multiplication as known in the mathematics art.

When the value of the radius curvatures R1, R2 and R3 is smaller than [0.25*(x1, x2, or x3)], a size of the rounded structure in the corner of the emission areas E1, E2 and E3 becomes too small so that it can cause a deterioration on the spreading of the emission layers 510, 520 and 530 to the corner of the emission areas E1, E2 and E3. On the other hand, when the value of the radius curvatures R1, R2 and R3 is larger than [0.5*(x1, x2, or x3)], the entire structure of the emission areas E1, E2 and E3 cannot have the polygonal structure.

As a result, the first emission area E1, the second emission area E2, and the third emission area E3 are formed in the same structure, for example, the first radius curvature R1 can be set to (0.25*x1), the second radius curvature R2 can be set to (0.25*x2), and the third radius curvature R3 can be set to (0.25*x3). In this case, as 'x2', and 'x3' are the same, the first radius curvature R1, the second radius curvature R2, and the third radius curvature R3 can be set identical to each other.

However, each of the radius curvatures R1, R2 and R3 can be different due to a manufacturing process error. For example, a predetermined difference can be set between each of the radius curvatures R1, R2 and R3. In consideration of the tolerance, each of the radius curvatures R1, R2 and R3 can have a varying range of ±10%. When the first emission area E1, the second emission area E2, and the third emission area E3 are formed in the same structure, the radius curvatures R1, R2 and R3 can satisfy the following condition as shown in [Equation 1].

$$R1:R2:R3=0.9\sim1.1:0.9\sim1.1:0.9\sim1.1 \qquad \text{[Equation 1]}$$

Meanwhile, the first electrodes 310, 320 and 330 are formed in the emission areas E1, E2 and E3, respectively. The edge of the first electrodes 310, 320 and 330 is covered by the bank 400, and the exposed portion of the first electrodes 310, 320 and 330, which is not covered by the bank 400, corresponds to the emission areas E1, E2 and E3.

Accordingly, the first electrode 310 allocated to the first emission area E1 has a relatively large sized area in comparison with the first emission area E1, whereby the edge of the first electrode 310 allocated to the first emission area E1 is covered by the bank 400. Also, the first electrode 320 allocated to the second emission area E2 has a relatively large sized area in comparison with the second emission area E2, whereby the edge of the first electrode 320 allocated to the second emission area E2 is covered by the bank 400. Also, the first electrode 330 allocated to the third emission area E3 has a relatively large sized area in comparison with the third emission area E3, whereby the edge of the first electrode 330 allocated to the third emission area E3 is covered by the bank 400.

In this case, each of the first electrodes 310, 320 and 330 can be formed in the structure which is similar to the structure of each of the emission areas E1, E2 and E3. In detail, the edges of the first electrodes 310, 320 and 330 can extend along the edges of the emission areas E1, E2 and E3 in the periphery of the emission areas E1, E2 and E3, respectively.

Accordingly, as the edge of each of the first electrodes 310, 320 and 330 is covered by the bank 400, there is no need for the rounded structure in each corner of the first electrodes 310, 320 and 330, which is similar to that of the emission areas E1, E2 and E3. Thus, as shown in the drawings, the corner of each of the first electrodes 310, 320 and 330 can be formed in the angled structure instead of the round structure. Accordingly, the first electrodes 310, 320 and 330 can be formed in the polygonal structure with the angled corners, and more particularly, the rectangular structure with the angled corners. However, in some cases, the first electrodes 310, 320 and 330 can be formed in the polygonal structure with the rounded corner(s) which are similar to the round corner(s) of the emission areas E1, E2 and E3, and this will be described in detail with reference to FIG. 4.

Figure 4:
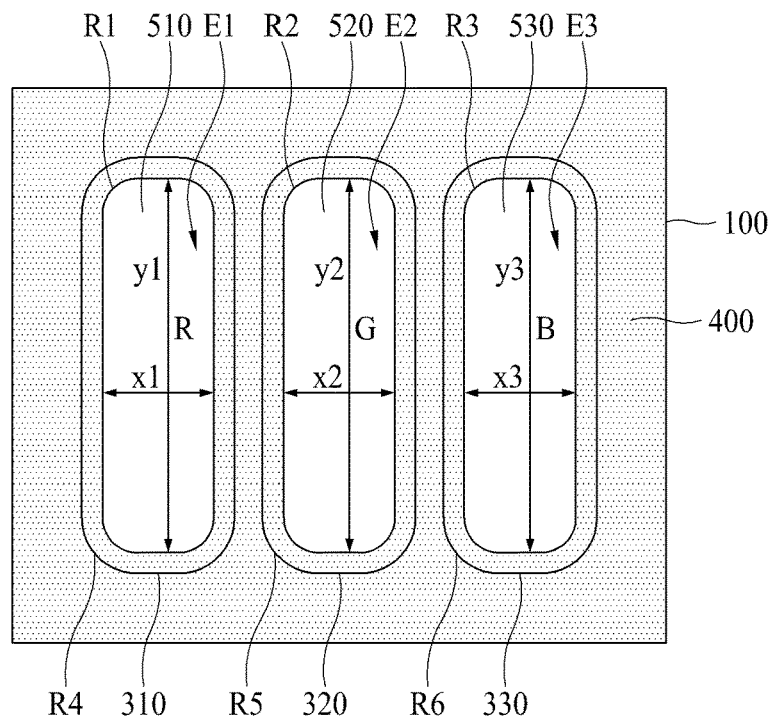
FIG. 4 is a plane view illustrating an electroluminescent display device according to another example of the present disclosure.

FIG. 4 is a plane view illustrating an electroluminescent display device according to another example of the present disclosure. Except that the first electrodes 310, 320 and 330 are formed in a quadrangle structure with rounded corners, the electroluminescent display device of FIG. 4 is identical, in the structure, to the electroluminescent display device of FIG. 3, whereby the same reference numbers will be used throughout the drawings to refer to the same parts. Hereinafter, the different structures will be described in detail as follows.

As shown in FIG. 4, the first electrodes 310, 320 and 330 are provided with rounded corners. In detail, the first electrode 310 allocated to the first emission area E1 is formed in a structure with any one rounded corner having a fourth radius curvature R4, the first electrode 320 allocated to the second emission area E2 is formed in a structure with any one rounded corner having a fifth radius curvature R5, and the first electrode 330 allocated to the third emission area E3 is formed in a structure with any one rounded corner having a sixth radius curvature R6. In this case, the other three corners of the first electrode 310 allocated to the first emission area E1 can be formed in the rounded structure with the fourth radius curvature R4, the other three corners of the first electrode 320 allocated to the second emission area E2 can be formed in the rounded structure with the fifth radius curvature R5, and the other three corners of the first electrode 330 allocated to the third emission area E3 can be formed in the rounded structure with the sixth radius curvature R6.

The structure of the first electrode 310 allocated to the first emission area E1, the structure of the first electrode 320 allocated to the second emission area E2, and the structure of the first electrode 330 allocated to the third emission area E3 can be identical to one another. That is, the respective first electrodes 310, 320 and 330 have the same short axis, and the respective first electrodes 310, 320 and 330 have the same long axis. In this case, the fourth to sixth radius curvatures R4, R5 and R6 can be the same. However, in the same manner as the aforementioned first to third radius curvatures R1, R2 and R3, there can be a varying range of ±10% in each of the fourth to sixth radius curvatures R4, R5 and R6.

Also, the fourth radius curvature R4 can correspond to the first radius curvature R1, the fifth radius curvature R5 can correspond to the second radius curvature R2, and the sixth radius curvature R6 can correspond to the third radius curvature R3, but not necessarily.

Figure 5:
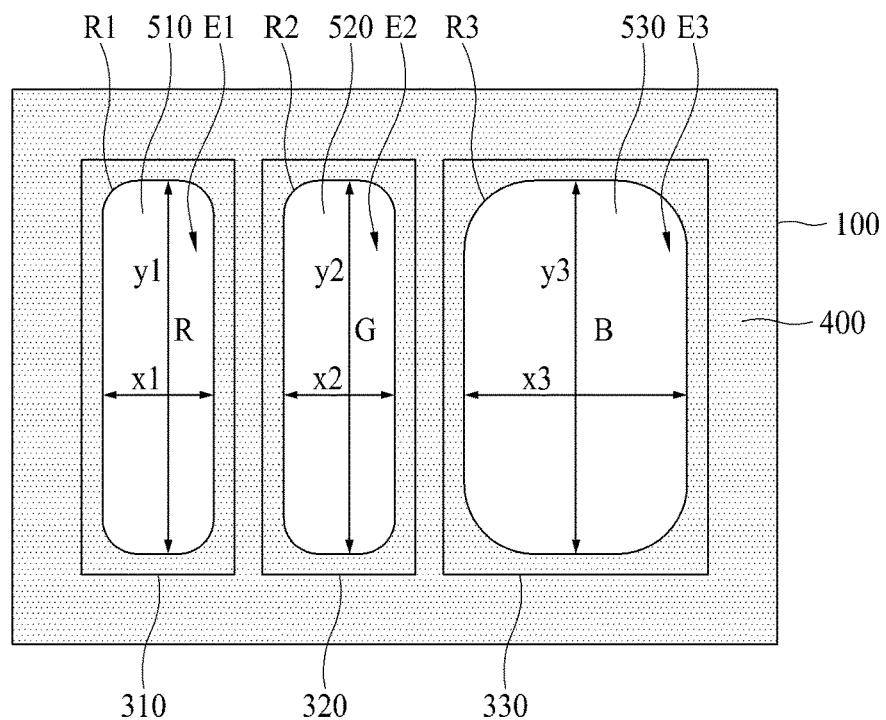
FIG. 5 is a plane view illustrating an electroluminescent display device according to another example of the present disclosure.

FIG. 5 is a plane view illustrating an electroluminescent display device according to another example of the present disclosure. The electroluminescent display device of FIG. 5 is different from the electroluminescent display device of FIG. 3 since the respective emission areas E1, E2 and E3 have different sizes, and the different structures will be described below in detail.

As shown in FIG. 5, a corner of the first emission area E1 is formed in a rounded structure with a first radius curvature R1, a corner of the second emission area E2 is formed in a rounded structure with a second radius curvature R2, and a corner of the third emission area E3 is formed in a rounded structure with a third radius curvature R3.

In this case, a long-axis width y1 of the first emission area E1, a long-axis width y2 of the second emission area E2, and a long-axis width y3 of the third emission area E3 are identical to one another. A short-axis width x1 of the first emission area E1 and a short-axis width x2 of the second emission area E2 are identical to each other; however, a short-axis width x3 of the third emission area E3 is larger than each of the short-axis width x1 of the first emission area E1 and the short-axis width x2 of the second emission area E2. An emission efficiency in the third emission layer 530 having a blue (B) emitting layer can be improved over an emission efficiency in each of the first emission layer 510 having a red (R) emitting layer and the second emission layer 520 having a green (G) emitting layer. For example, in case of the example shown in FIG. 5, an area of the third emission area E3 is relatively larger than each of an area of the first emission area E1 and an area of the second emission area E2, whereby an area of the third emission layer 530 is relatively larger than each of an area of the first emission layer 510 and an area of the second emission layer 520, which in turn improves the emission efficiency of the blue (B) emitting layer. To this end, the short-axis width x3 of the third emission area E3 is larger than each of the short-axis width x1 of the first emission area E1 and the short-axis width x2 of the second emission area E2.

Accordingly, when the long-axis width y1 of the first emission area E1, the long-axis width y2 of the second emission area E2, and the long-axis width y3 of the third emission area E3 are identical to one another, and the short-axis width x3 of the third emission area E3 is larger than each of the short-axis width x1 of the first emission area E1 and the short-axis width x2 of the second emission area E2, the spreading characteristics of the third emission layer 530 formed in the third emission area E3 can be different from the spreading characteristics of the second emission layer 520 formed in the second emission area E2 and the spreading characteristics of the first emission layer 510 formed in the first emission area E1.

Thus, the first radius curvature R1 in at least one corner of the first emission area E1 can be identical to the second radius curvature R2 in at least one corner of the second emission area E2; however, the third radius curvature R3 in at least one corner of the third emission area E3 can be different from the first radius curvature R1 and/or the second radius curvature R2. In detail, the third radius curvature R3 can be larger than each of the first radius curvature R1 and the second radius curvature R2.

The area of the third emission area E3 is relatively larger than each of the area of the first emission area E1 and the area of the second emission area E2. However, if the radius curvature R3 in the corner of the third emission area E3 were identical to the first radius curvature R1 in the corner of the first emission area E1 and the second radius curvature R2 in the corner of the second emission area E2, then a distance between the center of the third emission area E3 and the corner of the third emission area E3 can be equal to each of a distance between the center of the first emission area E1 and the corner of the first emission area E1 and/or a distance between the center of the second emission area E2 and the corner of the second emission area E2. In that case, the third emission layer 530 may not sufficiently spread to the corner of the third emission area E3. Thus, in FIG. 5, the third radius curvature R3 in the corner of the third emission area E3 having the relatively large sized area is larger than each of the first radius curvature R1 in the corner of the first emission area E1 having the relatively small sized area and the second radius curvature R2 in the corner of the second emission area E2 having the relatively small sized area, to thereby minimize the difference in each distance between the center and the corner in the respective emission areas E1, E2 and E3. Accordingly, the emission layer 510, 520 and 530 uniformly spreads to the corners of each of the emission areas E1, E2 and E3.

Accordingly, when the long-axis widths y1, y2 and y3 of the emission areas E1, E2 and E3 are the same, and the short-axis widths x1, x2 and x3 of the emission areas E1, E2 and E3 are not the same, a ratio of the first radius curvature R1, the second radius curvature R2, and the third radius curvature R3 is set to be identical to (or to correspond to) a ratio of the short-axis width x1 of the first emission area E1, the short-axis width x2 of the second emission area E2, and the short-axis width x3 of the third emission area E3. For example, when a ratio of the short-axis width x1 of the first emission area E1, the short-axis width x2 of the second emission area E2, and the short-axis width x3 of the third emission area E3 can be set to be 1:1:1.5, a ratio of the first radius curvature R1, the second radius curvature R2, and the third radius curvature R3 can be also set to be 1:1:1.5.

In this case, in the same manner as the above FIG. 3, the radius curvatures R1, R2 and R3 of any one of the emission areas E1, E2 and E3 as a reference point can be set within a range of [0.25*(x1, x2, or x3)]~[0.5*(x1, x2, or x3)].

Also, in the same manner as the above examples, each of the radius curvatures R1, R2 and R3 can have a varying range of ±10%. Thus, when the long-axis widths y1, y2, and y3 of the emission areas E1, E2 and E3 are the same, and the short-axis widths x1, x2 and x3 of the emission areas E1, E2 and E3 are not the same, the radius curvatures R1, R2 and R3 can satisfy the following conditions as shown in [Equation 2].

$$R1:R2:R3=[(0.9\sim1.1)*x1]:[(0.9\sim1.1)*x2]:[(0.9\sim1.1)*x3] \quad \text{[Equation 2]}$$

The first electrodes 310, 320 and 330 are formed in the emission areas E1, E2 and E3, respectively.

The area of the third emission area E3 is relatively larger than each of the area of the first emission area E1 and the area of the second emission area E2, whereby the area of the first electrode 330 allocated to the third emission area E3 can be relatively larger than each of the area of the first electrode 310 allocated to the first emission area E1 and the area of the first electrode 320 allocated to the second emission area E2.

In detail, the long-axis widths are the same in the respective first electrodes 310, 320 and 330; however, the short-axis width of the first electrode 330 allocated to the third emission area E3 can be larger than the short-axis width of the first electrode 310 allocated to the first emission area E1 and/or the short-axis width of the first electrode 320 allocated to the second emission area E2.

The first electrodes 310, 320 and 330 are formed in the structure which is similar to the structure of the emission areas E1, E2 and E3; however, the corner(s) of the first electrodes 310, 320 and 330 are not rounded, but are angled.

Figure 6:
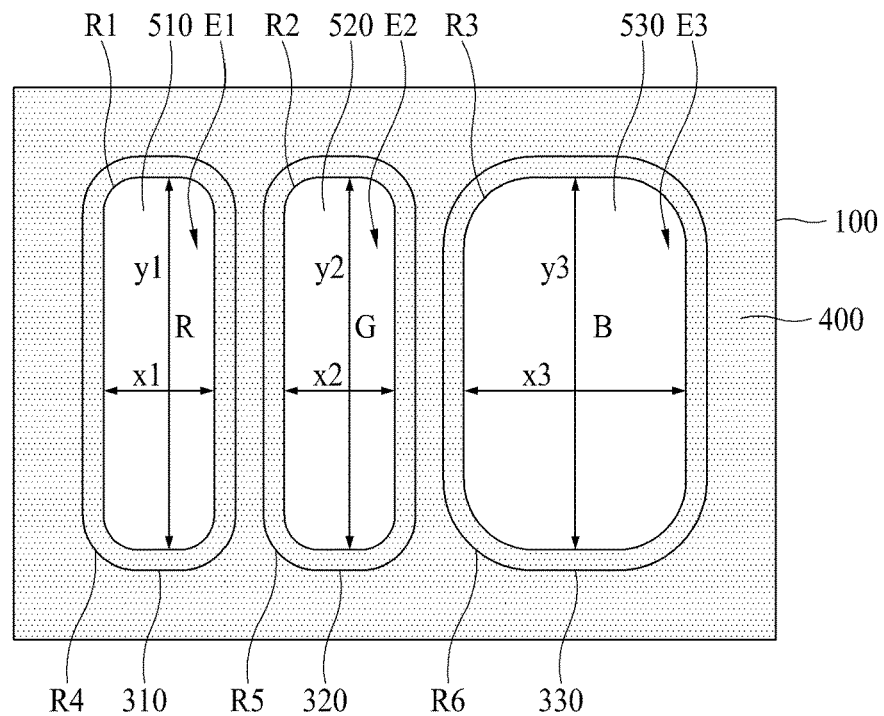
FIG. 6 is a plane view illustrating an electroluminescent display device according to another example of the present disclosure.

FIG. 6 is a plane view illustrating an electroluminescent display device according to another example of the present disclosure. Except that a first electrode 310, 320 and 330 is formed in a quadrangle structure with rounded corners, the electroluminescent display device of FIG. 6 is identical in structure to the electroluminescent display device of FIG. 5.

As shown in FIG. 6, at least one corner of the first electrode 310 allocated to the first emission area E1 is formed in a rounded structure with a fourth radius curvature R4, at least one corner of the first electrode 320 allocated to the second emission area E2 is formed in a rounded structure with a fifth radius curvature R5, and at least one corner of the first electrode 330 allocated to the third emission area E3 is formed in a rounded structure with a sixth radius curvature R6.

In this case, the fourth radius curvature R4 is corresponding to the first radius curvature R1, the fifth radius curvature R5 is corresponding to the second radius curvature R2, and the sixth radius curvature R6 is corresponding to the third radius curvature R3. Further, the third radius curvature R3 is larger than the first radius curvature R1 and/or the second radius curvature R2, whereby the sixth radius curvature R6 can be larger than the fourth radius curvature R4 and/or the fifth radius curvature R5, but not necessarily.

Otherwise, the fourth radius curvature R4, the fifth radius curvature R5, and the sixth radius curvature R6 may be identical to one another. In the same manner as the aforementioned first to third radius curvatures R1, R2 and R3, each of the radius curvatures R4, 5 and R6 can have a varying range of ±10%.

Figure 7:
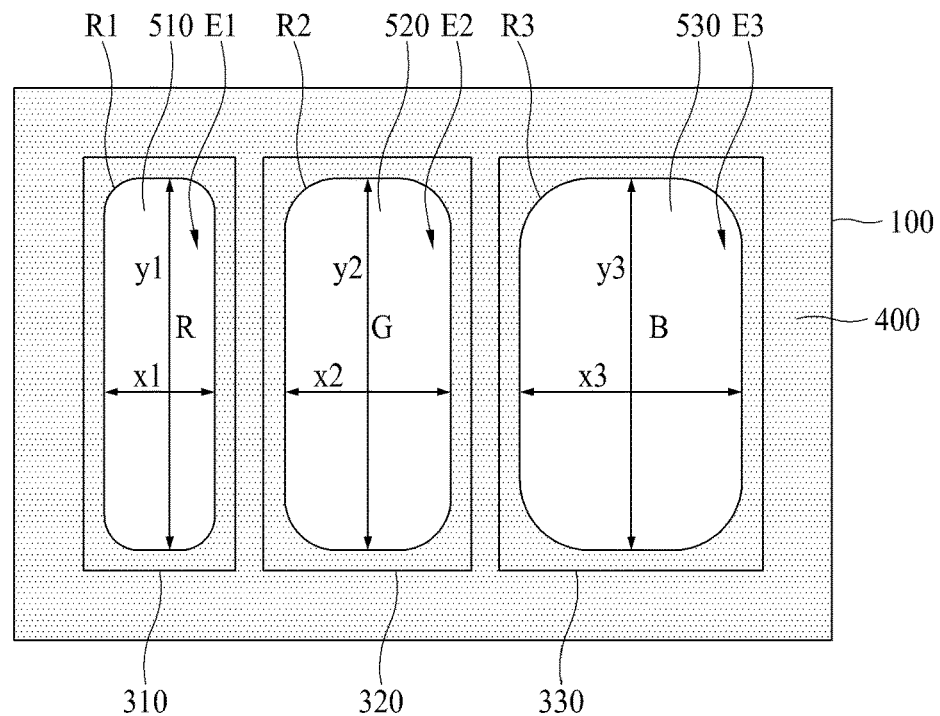
FIG. 7 is a plane view illustrating an electroluminescent display device according to another example of the present disclosure.

FIG. 7 is a plane view illustrating an electroluminescent display device according to another example of the present disclosure. The electroluminescent display device of FIG. 7 is different from the electroluminescent display device of FIG. 3 since the respective emission areas E1, E2 and E3 have the different sizes, and the different structures will be described below in detail.

As shown in FIG. 7, a long-axis width y1 of the first emission area E1, a long-axis width y2 of the second emission area E2, and a long-axis width y3 of the third emission area E3 are identical to one another. However, a short-axis width x1 of the first emission area E1, a short-axis width x2 of the second emission area E2, and a short-axis width x3 of the third emission area E3 are different from each other. In detail, the short-axis width x2 of the second emission layer E2 is larger than the short-axis width x1 of the first emission area E1, and the short-axis width x3 of the third emission area E3 is larger than the short-axis width x2 of the second emission area E2.

Accordingly as the short-axis widths x1, x2 and x3 of the emission areas E1, E2 and E3 are different from each other, the respective emission areas E1, E2 and E3 have the different radius curvatures R1, R2 and R3 in their corners. In detail, the second radius curvature R2 in at least one corner of the second emission area E2 is larger than the first radius curvature R1 in at least one corner of the first emission area E1, and the third radius curvature R3 in at least one corner of the third emission area E3 is larger than the second radius curvature R2 in at least one corner of the second emission area E2. Accordingly, the emission layers 510, 520 and 530 can smoothly spread to each corner in each of the emission areas E1, E2 and E3.

In this case, a ratio of the first radius curvature R1, the second radius curvature R2, and the third radius curvature R3 is set to be identical to a ratio of the short-axis width x1 of the first emission area E1, the short-axis width x2 of the second emission area E2, and the short-axis width x3 of the third emission area E3. For example, when a ratio of the short-axis width x1 of the first emission area E1, the short-axis width x2 of the second emission area E2, and the short-axis width x3 of the third emission area E3 can be set to be 1:1.5:2, a ratio of the first radius curvature R1, the second radius curvature R2, and the third radius curvature R3 can be also set to be 1:1.5:2. Also, in the same manner as the aforementioned examples, each of the radius curvatures R1, R2 and R3 can have a varying range of ±10%. Accordingly, when the long-axis widths y1, y2 and y3 of the emission areas E1, E2 and E3 are identical to one another, and the short-axis widths x1, x2 and x3 of the emission areas E1, E2 and E3 are different from each other, the radius curvatures R1, R2 and R3 can satisfy the above Equation 2.

Meanwhile, the emission areas E1, E2 and E3 have the different structures from one another, whereby the respective first electrodes 310, 320 and 330 can have the different structures from one another. In detail, the long-axis widths y1, y2 and y3 of the first electrodes 310, 320 and 330 are identical to one another. However, the short-axis width x2 of the first electrode 320 formed in the second emission area E2 is larger than the short-axis width x1 of the first electrode 310 formed in the first emission area E1, and the short-axis width x3 of the first electrode 330 formed in the third emission area E3 is larger than the short-axis width x2 of the first electrode 320 formed in the second emission area E2.

Figure 8:
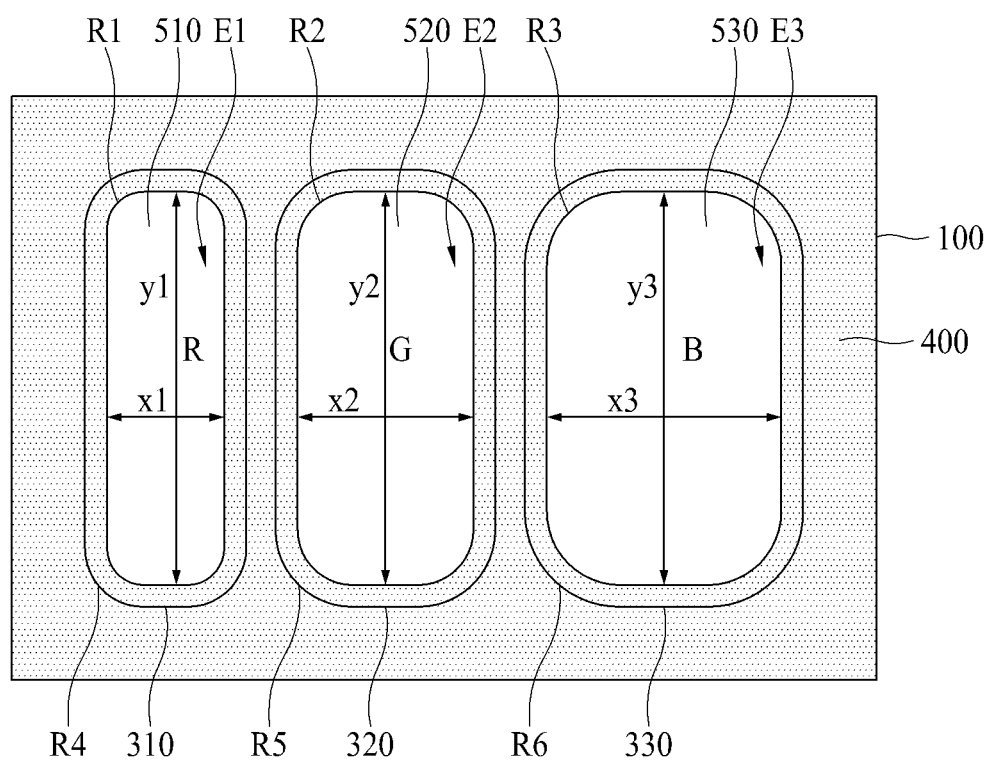
FIG. 8 is a plane view illustrating an electroluminescent display device according to another example of the present disclosure.

FIG. 8 is a plane view illustrating an electroluminescent display device according to another example of the present invention. Except that the first electrodes 310, 320 and 330 are formed in a quadrangle structure with rounded corners, the electroluminescent display device of FIG. 8 is identical in structure to the electroluminescent display device of FIG. 7.

As shown in FIG. 8, at least one corner of the first electrode 310 allocated to the first emission area E1 is formed in a rounded structure with a fourth radius curvature R4, at least one corner of the first electrode 320 allocated to the second emission area E2 is formed in a rounded structure with a fifth radius curvature R5, and at least one corner of the first electrode 330 allocated to the third emission area E3 is formed in a rounded structure with a sixth radius curvature R6.

In this case, the fourth radius curvature R4 is corresponding to the first radius curvature R1, the fifth radius curvature R5 is corresponding to the second radius curvature R2, and the sixth radius curvature R6 is corresponding to the third radius curvature R3. In this case, the second radius curvature R2 is larger than the first radius curvature R1, and the third radius curvature R3 is larger than the second radius curvature R2, whereby the fifth radius curvature R5 is larger than the fourth radius curvature R4, and the sixth radius curvature R6 is larger than the fifth radius curvature R5, but not necessarily.

Otherwise, the fourth radius curvature R4, the fifth radius curvature R5, and the sixth radius curvature R6 may be identical to one another. In the same manner as the aforementioned first to third radius curvatures R1, R2 and R3, each of the radius curvatures R4, R5 and R6 can have a varying range of ±10%.

Figure 9:
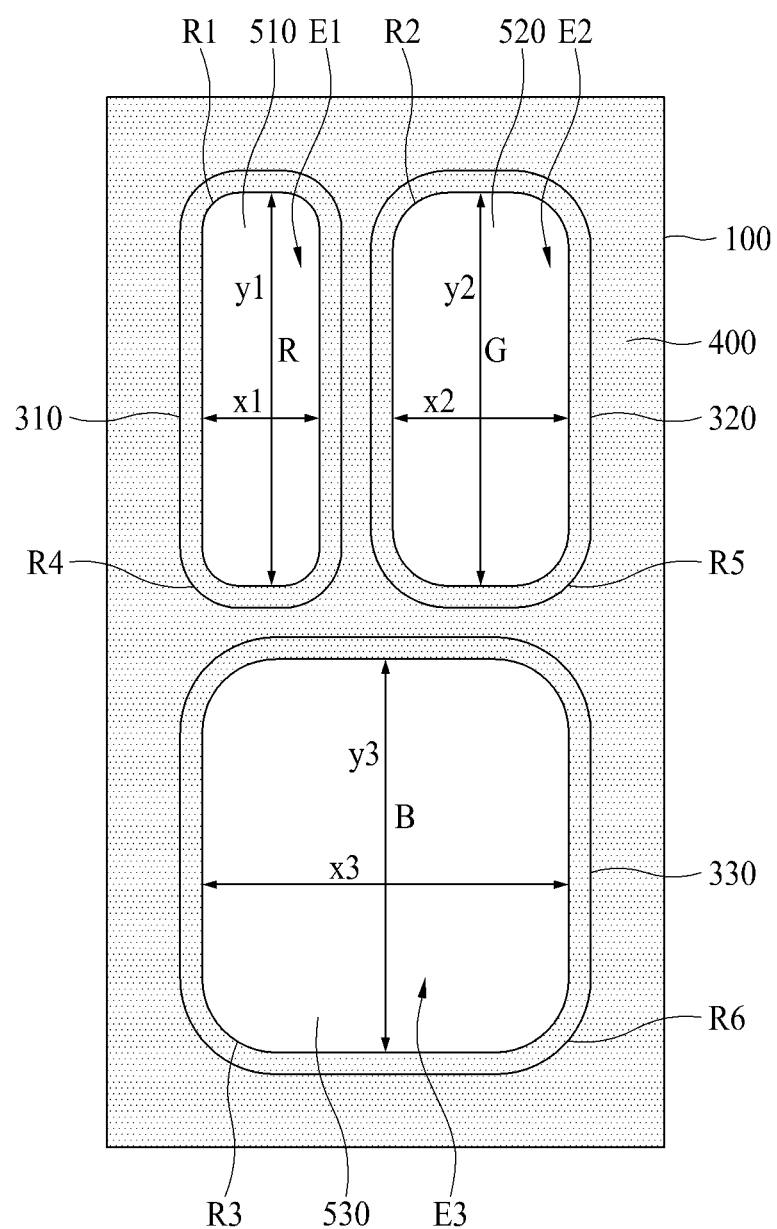
FIG. 9 is a plane view illustrating an electroluminescent display device according to another example of the present disclosure.

FIG. 9 is a plane view illustrating an electroluminescent display device according to another example of the present disclosure. The electroluminescent display device of FIG. 9 is different in the arrangement of first to third emission areas E1, E2 and E3 from the electroluminescent display device of FIG. 3, and the different structures will be described below in detail.

As shown in FIG. 9, the first and second emission areas E1 and E2 confronting each other are arranged in a horizontal direction, while the third emission area E3 is disposed below the first emission area E1 and the second emission area E2.

In this case, the first emission area E1, the second emission area E2, and the third emission area E3 have the different structures from one another. In detail, a long-axis width y1 of the first emission area E1 and a long-axis width y2 of the second emission area E2 are identical to each other; however, a long-axis width y3 of the third emission area E3 is different from the long-axis width y1 of the first emission area E1 and/or the long-axis width y2 of the second emission area E2. For example, the long-axis width y3 of the third emission area E3 is smaller than the long-axis width y1 of the first emission area E1 and/or the long-axis width y2 of the second emission area E2. Also, a short-axis width x2 of the second emission area E2 is larger than a short-axis width x1 of the first emission area E1, and a short-axis width x3 of the third emission area E3 is larger than the short-axis width x2 of the second emission area E2.

When the first emission area E1, the second emission area E2, and the third emission area E3 have the different structures from one another, a first radius curvature R1 in at least one corner of the first emission area E1, a second radius curvature R2 in at least one corner of the second emission area E2, and a third radius curvature R3 in at least one corner of the third emission area E3 can be different from one another.

Especially, when the long-axis widths y1, y2 and y3 of the emission areas E1, E2 and E3 are not identical, a value of the individual radius curvature R1, R2 and R3 can be set based on the short-axis widths x1, x2 and x3 of each of the emission areas E1, E2 and E3, and the long-axis widths y1, y2 and y3 of each of the emission areas E1, E2 and E3. In detail, the value of the first radius curvature R1 is set to $(¼*x1)+(¼*(y1\sim x1)/(4*x1))$, the value of the second radius curvature R2 is set to $(¼*x2)+(¼*(y2\sim x2)/(4*x2))$, and the value of the third radius curvature R3 is set to $(¼*x3)+(¼*(y3\sim x3)/(4*x3))$.

In the same manner as the aforementioned examples, each radius curvatures R1, R2 and R3 can have a varying range of ±10%. When the long-axis widths y1, y2 and y3 of the emission areas E1, E2 and E3 may not be identical to one another, the radius curvatures R1, R2 and R3 can satisfy the following conditions as shown in [Equation 3].

$$R1=0.9*[(¼*x1)+¼*(y1-x1)/(4*x1)]\sim 1.1*[(¼*x1)+¼*(y1-x1)/(4*x1)]$$

$$R2=0.9*[(¼*x2)+¼*(y2-x2)/(4*x2)]\sim 1.1*[(¼*x2)+¼*(y2-x2)/(4*x2)]$$

$$R3=0.9*[(¼*x3)+¼*(y3-x3)/(4*x3)]\sim 1.1*[(¼*x3)+¼*(y3-x3)/(4*x3)]$$ [Equation 3]

Meanwhile, although not shown, in the structure of FIG. 9, the short-axis width x1 of the first emission area E1 can be identical to the short-axis width x2 of the second emission area E2. In this case, the radius curvature R1, R2 and R3 of each of the emission area E1, E2 and E3 can satisfy the above [Equation 3].

Also, the first electrodes 310, 320 and 330 have a relatively large sized area in comparison with the emission areas E1, E2 and E3. In addition, the first electrodes 310, 320 and 330 are formed in a structure similar to that of the emission areas E1, E2 and E3.

In this case, at least one corner of the first electrode 310 allocated to the first emission area E1 is formed in a rounded structure with a fourth radius curvature R4, at least one corner of the first electrode 320 allocated to the second emission area E2 is formed in a rounded structure with a fifth radius curvature R5, and at least one corner of the first electrode 330 allocated to the third emission area E3 is formed in a rounded structure with a sixth radius curvature R6.

In this case, the fourth radius curvature R4 is corresponding to the first radius curvature R1, the fifth radius curvature R5 is corresponding to the second radius curvature R2, and the sixth radius curvature R6 is corresponding to the third radius curvature R3, but not necessarily. Otherwise, the fourth radius curvature R4, the fifth radius curvature R5, and the sixth radius curvature R6 may be identical to one another. Also, each of the radius curvatures R4, R5 and R6 can have a varying range of ±10%.

Although not shown in FIG. 9, each corner of the first electrodes 310, 320 and 330 can be formed in an angled structure, rather than in the rounded structure.

Figure 10:
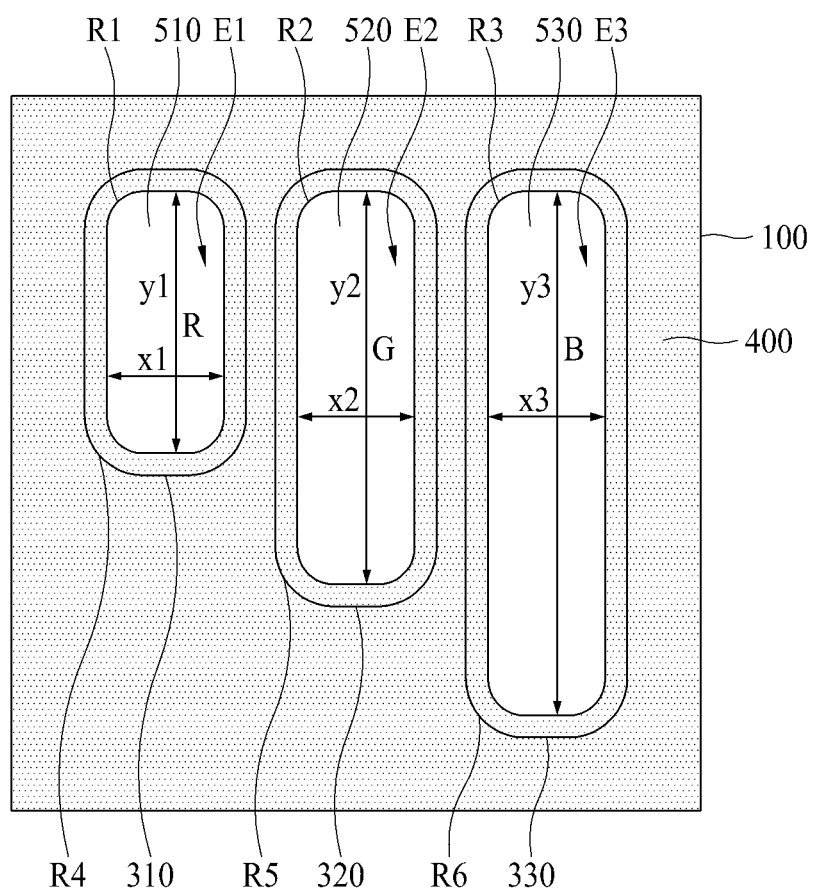
FIG. 10 is a plane view illustrating an electroluminescent display device according to another example of the present disclosure.
Figure 11:
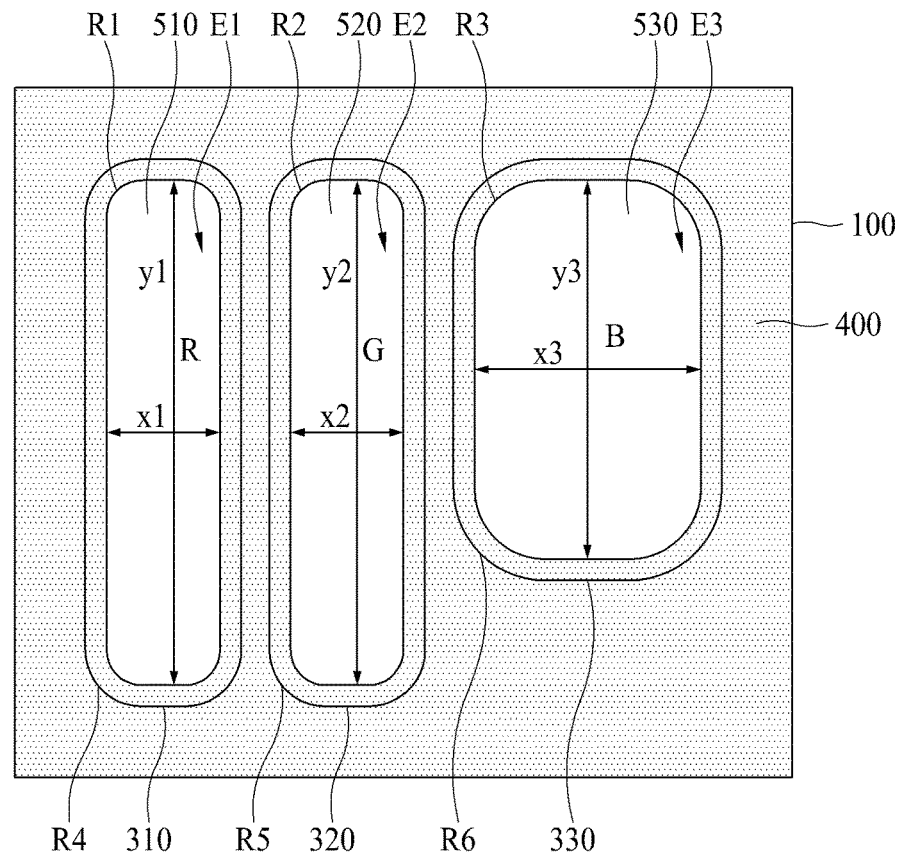
FIG. 11 is a plane view illustrating an electroluminescent display device according to another example of the present disclosure.

Each corner of the first electrodes 310, 320 and 330 is formed in the rounded structure or angled structure, which will be identically applied to the examples of FIGS. 10 and 11.

FIG. 10 is a plane view illustrating an electroluminescent display device according to another example of the present disclosure. The electroluminescent display device of FIG. 10 is different from the electroluminescent display device of FIG. 3 since the respective emission areas E1, E2 and E3 have the different long-axis widths y1, y2 and y3, and the different structures will be described below in detail.

As shown in FIG. 10, a long-axis width y2 of the second emission area E2 is larger than a long-axis width y1 of the first emission area E1, and a long-axis width y3 of the third emission area E3 is larger than the long-axis width y2 of the second emission area E2. In this case, short-axis widths x1, x2 and x3 of the emission areas E1, E2 and E3 can be identical to one another, but not necessarily. For example, the short-axis width x1 of the first emission area E1 can be identical to the short-axis width x2 of the second emission area E2, and the short-axis width x3 of the third emission area E3 can be larger than the short-axis width x1 of the first emission area E1 and the short-axis width x2 of the second emission area E2. In another example, the short-axis width x2 of the second emission area E2 can be larger than the short-axis width x1 of the first emission area E1, and the short-axis width x3 of the third emission area E3 can be larger than the short-axis width x2 of the second emission area E2.

When the long-axis widths y1, y2 and y3 of the emission areas E1, E2 and E3 are different from one another, the individual radius curvature R1, R2 and R3 can satisfy the above [Equation 3].

FIG. 11 is a plane view illustrating an electroluminescent display device according to another example of the present invention. Hereinafter, only the structures which are different from those of FIG. 3 will be described in detail as follows.

As shown in FIG. 11, first and second emission areas E1 and E2 are identical in structure to each other; however, a third emission area E3 is different in structure from the first emission area E1 and/or the second emission area E2. In detail, a long-axis width y1 of the first emission area E1 is identical to a long-axis width y2 of the second emission area E2, and a short-axis width x1 of the first emission area E1 is identical to a short-axis width x2 of the second emission area E2. Thus, a radius curvature R1 in at least one corner of the first emission area E1 can be identical to a radius curvature R2 in at least one corner of the second emission area E2. As a variation, the first and second emission areas E1 and E2 can be different in structure from each other.

However, a long-axis width y3 of the third emission area E3 is smaller than the long-axis width y1 of the first emission area E1 and/or the long-axis width y2 of the second emission area E2, while a short-axis width x3 of the third emission area E3 is larger than the short-axis width x1 of the first emission area E1 and/or the short-axis width x2 of the second emission area E2.

As the long-axis width y3 of the third emission area E3 is different from the long-axis width y1 of the first emission area E1 and/or the long-axis width y2 of the second emission area E2, the individual radius curvature R1, R2 and R3 can satisfy the above [Equation 3].

Meanwhile, although not shown, in case of the structure shown in FIG. 11, the short-axis width x2 of the second emission area E2 can be larger than the short-axis width x1 of the first emission area E1. In this case, the individual radius curvature R1, R2 and R3 can satisfy the above [Equation 3].

Figure 12:
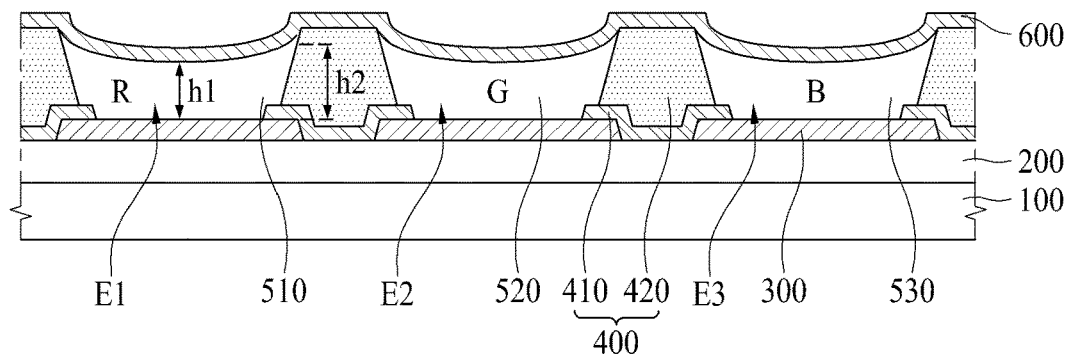
FIG. 12 is a cross sectional view illustrating an electroluminescent display device according to another example of the present disclosure.

FIG. 12 is a cross sectional view illustrating an electroluminescent display device according to another example of the present disclosure. Except the structure of a bank 400, the electroluminescent display device of FIG. 12 is identical in structure to the electroluminescent display device of FIG. 2, whereby the same reference numbers will be used in FIG. 12 to refer to the same parts. Hereinafter, the different structures will be described in detail as follows.

As shown in FIG. 12, a bank 400 includes a first bank 410 and a second bank 420.

The first bank 410 covers an end of a first electrode 300, and the first bank 410 is formed on a circuit device layer 200. A thickness of the first bank 410 is relatively smaller (or thinner) than a thickness of the second bank 420, and a width of the first bank 410 is relatively larger (or wider) than a width of the second bank 420. In the same manner as the emission layers 510, 520 and 530, the first bank 410 having the above structure has the hydrophilic property. The first bank 410 having the hydrophilic property can be formed of an inorganic insulating material such as silicon oxide. Thus, when the emission layers 510, 520 and 530 are formed by a solution process, a solution for forming the emission layers 510, 520 and 530 can spread easily on the first bank 410.

The second bank 420 is formed on the first bank 410. The width of the second bank 420 is smaller (or narrower) than the width of the first bank 410. Here, each of the first and second banks 410 and 420 can be arranged in a matrix configuration (e.g., a grid configuration) or in a linear configuration (e.g., in vertical columns). The second bank 420 can be obtained by coating a mixture solution of an organic insulating material having the hydrophilic property and a hydrophobic material such as fluorine, and patterning the coated mixture solution by the use of a photolithography process. By the light irradiated for the photolithography process, the hydrophobic material such as fluorine can move to an upper portion of the second bank 420, whereby the upper portion of the second bank 420 has the hydrophobic property, and the remaining portions of the second bank 420 have the hydrophilic property. That is, the lower portion of the second bank 420 which is in contact with the first bank 410 has the hydrophilic property, while the upper portion of the second bank 420 has the hydrophobic property, but not limited to this structure. For example, the entire portions of the second bank 420 can have the hydrophobic property.

Herein, spreadability of the solution for forming the emission layers 510, 520 and 530 can be improved owing to the first bank 410 having the hydrophilic property and the lower portion of the second bank 420 having the hydrophilic property. Especially, as the first bank 410 has the relatively smaller thickness and the relatively larger width in comparison to the second bank 420, it is possible to prepare a 2-step structure of the hydrophilic property by the combination of the first bank 410 and second bank 420, whereby the solution for forming the emission layers 510, 520 and 530 can easily spread to the boundary edges of the emission areas E1, E2 and E3.

Also, the upper portion of the second bank 420 having the hydrophobic property prevents the solution for forming the corresponding emission layers 510, 520 and 530 from spreading to another neighboring emission areas E1, E2 and E3 so that it is possible to prevent the corresponding emission layers 510, 520 and 530 from being mixed with the emission layer of another neighboring emission areas E1, E2 and E3. The bank 400 of FIG. 12 can be applied to any of the examples of the electroluminescent display device described according to the present disclosure.

Figure 13:
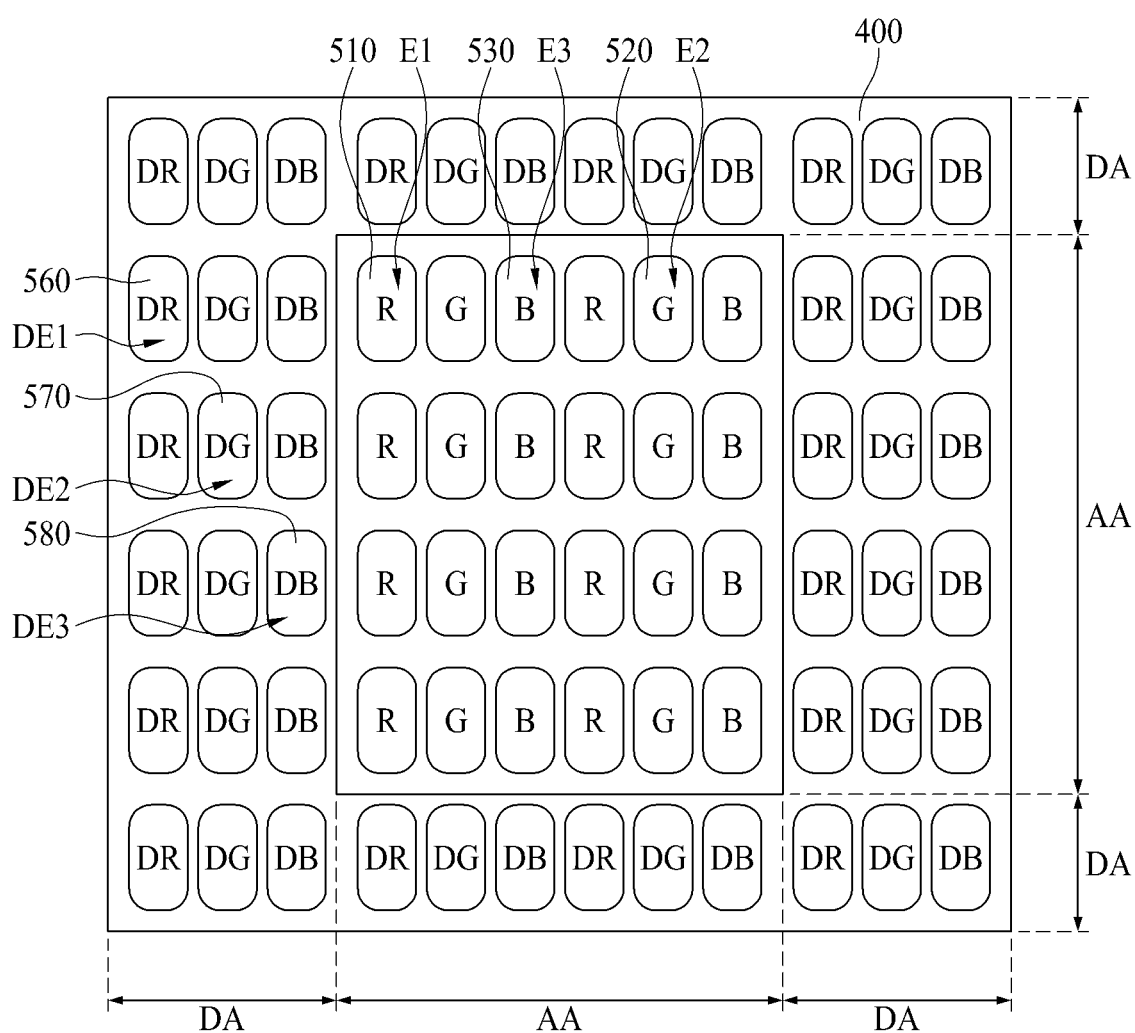
FIG. 13 is a plane view illustrating an electroluminescent display device according to another example of the present disclosure.

FIG. 13 is a plane view illustrating an electroluminescent display device according to another example of the present disclosure, which relates to an electroluminescent display device including an active area AA and a dummy area DA.

The active area AA serves as a display area for displaying an image. The active area AA is provided with a bank 400 for defining a first emission area E1, a second emission area E2, and a third emission area E3, wherein a first emission layer 510 is provided in the first emission area E1, a second emission layer 520 is provided in the second emission area E2, and a third emission layer 530 is provided in the third emission area E3.

A structure of the first, second and third emission areas E1, E2 and E3 and a structure of the first, second and third emission layers 510, 520 and 530 in FIG. 13 can be variously changed as shown in FIGS. 3 to 11.

The dummy area DA is provided to surround the active area AA. In detail, the dummy area DA is provided in the left, right, lower and upper peripheral sides of the active area AA. In the same manner as the active area AA, the dummy area DA is provided with a bank 400 for defining dummy emission areas DE1, DE2 and DE3. The bank 400 is formed in a matrix configuration on the entire area including the active area AA and the dummy area DA, to thereby define the emission areas E1, E2 and E3 and the dummy emission areas DE1, DE2 and DE3.

The dummy emission areas DE1, DE2 and DE3 are provided with dummy emission layers 560, 570 and 580. In detail, the first dummy emission layer 560 is provided in the first dummy emission area DE1, the second dummy emission layer 570 is provided in the second dummy emission area DE2, and the third dummy emission layer 580 is provided in the third dummy emission area DE3.

The dummy area DA is not the area for displaying an image, whereby a light emission is not generated in the dummy emission areas DE1, DE2 and DE3 included in the dummy area DA. The dummy area DA is provided to realize a uniform profile between the emission layers 510, 520 and 530 formed in the center of the active area AA and the emission layers 510, 520 and 530 formed in the periphery of the active area AA.

When the emission layers 510, 520 and 530 are formed by a solution process, it may cause a difference between a drying speed of the emission layers 510, 520 and 530 formed at the center of a substrate and a drying speed of the emission layers 510, 520 and 530 formed at the periphery of the substrate. Thus, when forming only the active area AA without the dummy area DA, the profile of the emission layers 510, 520 and 530 formed at the center of the active area AA and the profile of the emission layers 510, 520 and 530 formed at the edge of the active area AA may be not uniform, whereby the light emission at the center of the active area AA and the light emission at the edge of the active area AA may be not uniform.

Thus, according to this example of the present disclosure, when the dummy area DA is formed at the periphery of the active area AA, and the emission layers 510, 520 and 530 are formed in the active area AA by the solution process, the dummy emission layers 560, 570 and 580 are also formed at the dummy area DA by the solution process. In this case, even though the profile of the dummy emission layers 560, 570 and 580 and the profile of the emission layers 510, 520 and 530 are not uniform, it is possible to realize the uniform profile of the emission layers 510, 520 and 530 over the entire active area AA.

Accordingly, the first dummy emission layer 560 is formed of the red (R) emitting layer which is the same as the first emission layer 510, and the first dummy emission layer 560 is manufactured together with the first emission layer 510. Also, the second dummy emission layer 570 is formed of the green (G) emitting layer which is the same as the second emission layer 520, and the second dummy emission layer 570 is manufactured together with the second emission layer 520. Also, the third dummy emission layer 580 is formed of the blue (B) emitting layer which is the same as the third emission layer 530, and the third dummy emission layer 580 is manufactured together with the third emission layer 530. For reference, in FIG. 13, the dummy emission layers 560, 570 and 580 in which the light emission is not generated can be marked as 'DR, DG, DB' so as to distinguish the emission layer 510, 520 and 530 for emitting red (R), green (G), and blue (B) light.

Accordingly, the dummy area DA is not the area for displaying an image, whereby there is no need to make the dummy emission layers 560, 570 and 580 uniformly spread in each dummy emission areas DE1, DE2 and DE3. Thus, there is no need to realize the same structure both in the emission areas E1, E2 and E3 and the dummy emission areas DE1, DE2 and DE3. That is, the dummy emission areas DE1, DE2 and DE3 can be formed in a polygonal structure having angled corners instead of rounded corners. However, in order to obtain consistency in the manufacturing process, the first dummy emission area DE1 can be formed in the polygonal structure (e.g., rectangle) having the rounded corners in the same manner as the first emission area E1, the second dummy emission area DE2 can be formed in the polygonal structure (e.g., rectangle) having the rounded corners in the same manner as the second emission area E2, and the third dummy emission area DE3 can be formed in the polygonal structure (e.g., rectangle) having the rounded corners in the same manner as the third emission area E3.

According to one embodiment of the present disclosure, the corner of the emission area is formed in the rounded structure. Thus, when the emission layer is formed by the solution process, the emission layer smoothly spreads to the corner of the emission area so that it is possible to realize the uniform light emission both in the corner of the emission area and the center of the emission area.

According to one embodiment of the present disclosure, as the radius curvature in the corner of the emission area having the relatively large size is larger than the radius curvature in the corner of the emission area having the relatively small size, it is possible to minimize the difference in each distance between the center and the corner in the respective emission areas, whereby the emission layer uniformly spreads to the corner of each emission area.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, if present, are incorporated herein by reference, in their entirety. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescent display device comprising:
   a first electrode provided on a substrate;
   a bank disposed on the first electrode and defining a plurality of emission areas above the first electrode;
   an emission layer provided in the plurality of emission areas and configured to emit light, wherein the emission layer in each of the plurality of emission areas has a curved top surface; and
   a second electrode provided on the bank and the emission layer,
   wherein among the plurality of emission areas, each of a first emission area and a second emission area is provided with a rounded corner,
   wherein a first radius curvature (R1) in the rounded corner of the first emission area is different from a second radius curvature (R2) in the rounded corner of the second emission area,
   wherein the first radius curvature (R1) has a value within a range of (0.25*x1)~(0.5*x1) where x1 is a short-axis width of the first emission area, and wherein the second radius curvature (R2) has a value within a range of (0.25*x2)~(0.5*x2) where x2 is a short-axis width of the second emission area.

2. The electroluminescent display device according to claim 1, wherein an area of the second emission area is larger than an area of the first emission area, and the second radius curvature (R2) is larger than the first radius curvature (R1).

3. The electroluminescent display device according to claim 1, wherein a long-axis width (y2) of the second emission area is identical to a long-axis width (y1) of the first emission area, the short-axis width (x2) of the second emission area is larger than the short-axis width (x1) of the first emission area, and the second radius curvature (R2) is larger than the first radius curvature (R1).

4. The electroluminescent display device according to claim 1, wherein a ratio of the first radius curvature (R1) and the second radius curvature (R2) satisfies the following equation:

$R1:R2=[(0.9\sim1.1)*x1]:[(0.9\sim1.1)*x2]$.

5. The electroluminescent display device according to claim 1, wherein a long-axis width (y2) of the second emission area is different from a long-axis width (y1) of the first emission area, wherein the first radius curvature (R1) is set to:

$0.9*[(\frac{1}{4}*x1)+\frac{1}{4}*(y1-x1)/(4*x1)]\sim1.1*[(\frac{1}{4}*x1)+\frac{1}{4}*(y1-x1)/(4*x1)]$, and wherein the second radius curvature (R2) is set to:

$0.9*[(\frac{1}{4}*x2)+\frac{1}{4}*(y2-x2)/(4*x2)]\sim1.1*[(\frac{1}{4}*x2)+\frac{1}{4}*(y2-x2)/(4*x2)]$.

6. The electroluminescent display device according to claim 5, wherein y2 is smaller than y1, and x2 is larger than x1, or wherein y2 is larger than y1, and x2 is the same as or larger than x1.

7. The electroluminescent display device according to claim 1, wherein the bank includes:

a first bank disposed directly on the first electrode and having a hydrophilic property, and a second bank disposed on the first bank and having a portion with a hydrophobic property.

8. The electroluminescent display device according to claim 7, wherein at least one of the first and second banks has a matrix configuration or a linear configuration.

9. The electroluminescent display device according to claim 1, wherein a radius curvature in a rounded corner of a first portion of the first electrode associated with the first emission area corresponds to the first radius curvature (R1) in the rounded corner of the first emission area, and wherein a radius curvature in a rounded corner of a second portion of the first electrode associated with the second emission area corresponds to the second radius curvature (R2) in the rounded corner of the second emission area.

10. The electroluminescent display device according to claim 1, wherein each of the first and second emission layers includes an emitting material layer and at least one of a hole injecting layer, a hole transporting layer and an electron transporting layer.

* * * * *